(12) United States Patent
Farquhar et al.

(10) Patent No.: US 8,137,148 B2
(45) Date of Patent: Mar. 20, 2012

(54) METHOD OF MANUFACTURING MONOLITHIC PARALLEL INTERCONNECT STRUCTURE

(75) Inventors: Donald Seton Farquhar, Niskayuna, NY (US); Anil Raj Duggal, Niskayuna, NY (US); Michael Scott Herzog, Vooheesville, NY (US); Jeffrey Michael Youmans, Saratoga Springs, NY (US); Stefan Rakuff, Clifton Park, NY (US); Linda Ann Boyd, Malta, NY (US)

(73) Assignee: General Electric Company, Niskayuna, NY (US)

( * ) Notice: Subject to any disclaimer, the term of this patent is extended or adjusted under 35 U.S.C. 154(b) by 105 days.

(21) Appl. No.: 12/570,024

(22) Filed: Sep. 30, 2009

(65) Prior Publication Data

US 2011/0074281 A1  Mar. 31, 2011

(51) Int. Cl.
*H01J 9/00* (2006.01)
*H01J 9/24* (2006.01)

(52) U.S. Cl. ............. 445/24; 445/25; 313/504; 313/505

(58) Field of Classification Search .......... 313/498–512; 445/24–25; 427/58, 64, 66
See application file for complete search history.

(56) References Cited

U.S. PATENT DOCUMENTS

| | | | |
|---|---|---|---|
| 6,803,720 B2 | 10/2004 | Kwong et al. | |
| 6,858,878 B2 * | 2/2005 | Yamazaki et al. | 257/98 |
| 6,870,196 B2 | 3/2005 | Strip | |
| 6,885,147 B2 | 4/2005 | Howard et al. | |
| 7,034,470 B2 | 4/2006 | Cok et al. | |
| 7,049,741 B2 | 5/2006 | Madathil et al. | |
| 7,049,757 B2 | 5/2006 | Foust et al. | |
| 7,157,156 B2 | 1/2007 | Raychaudhuri et al. | |
| 7,307,278 B2 | 12/2007 | Liu et al. | |
| 7,518,148 B2 | 4/2009 | Liu et al. | |
| 2004/0021425 A1 | 2/2004 | Foust et al. | |
| 2004/0140758 A1 | 7/2004 | Raychaudhuri et al. | |
| 2005/0052130 A1 | 3/2005 | Wei et al. | |
| 2005/0093001 A1 | 5/2005 | Liu et al. | |
| 2005/0258436 A1 | 11/2005 | Arai | |
| 2005/0270464 A1 * | 12/2005 | Seo et al. | 349/139 |
| 2006/0019573 A1 * | 1/2006 | Koo et al. | 445/24 |
| 2006/0049754 A1 | 3/2006 | Kwok et al. | |
| 2006/0066223 A1 | 3/2006 | Pschenitzka | |
| 2006/0226522 A1 | 10/2006 | Liu et al. | |
| 2007/0001583 A1 | 1/2007 | Nabeta et al. | |
| 2007/0164667 A1 * | 7/2007 | Ha et al. | 313/504 |
| 2007/0200489 A1 | 8/2007 | Poon et al. | |
| 2008/0143250 A1 | 6/2008 | Blochwitz-Nimoth et al. | |

(Continued)

FOREIGN PATENT DOCUMENTS

EP     1612658 A2    1/2006

(Continued)

OTHER PUBLICATIONS

Machine translation, Koshihara JP 2004-251981 A.*

(Continued)

*Primary Examiner* — Nimeshkumar Patel
*Assistant Examiner* — Jose M Diaz
(74) *Attorney, Agent, or Firm* — Mary Louise Gioeni

(57) ABSTRACT

An optoelectronic device having a monolithic interconnect structure includes a continuous anode layer, a discontinuous cathode layer, and an electroactive layer sandwiched between the continuous anode layer and the discontinuous cathode layer.

10 Claims, 3 Drawing Sheets

U.S. PATENT DOCUMENTS

| | | | |
|---|---|---|---|
| 2008/0150418 A1* | 6/2008 | Chae et al. | ............ 313/504 |
| 2008/0238310 A1 | 10/2008 | Forrest et al. | |
| 2009/0023232 A1 | 1/2009 | Taniguchi et al. | |

FOREIGN PATENT DOCUMENTS

| | | | |
|---|---|---|---|
| JP | 61138286 A | 6/1986 | |
| JP | 2004251981 A | 9/2004 | |
| JP | 2005017738 A | 1/2005 | |
| WO | WO2006010911 A2 | 2/2006 | |
| WO | WO2006013373 A2 | 2/2006 | |
| WO | WO2006071106 A1 | 7/2006 | |
| WO | WO2006078898 A2 | 7/2006 | |

OTHER PUBLICATIONS

PCT International Search Report dated Nov. 19, 2010 and Written Opinion.
Search Report and Written Opinion from corresponding PCT Application No. PCT/US2011/021125 mailed on Jun. 8, 2011.
JP61138286 Abstract, Jun. 25, 1986.
JP2004251981 Abstract, Sep. 9, 2004.
JP2005017738 Abstract, Jan. 20, 2005.

* cited by examiner

METHOD OF MANUFACTURING MONOLITHIC PARALLEL INTERCONNECT STRUCTURE

BACKGROUND

Optoelectronic devices generally include light-emitting devices and photovoltaic devices. These devices generally include an active layer sandwiched between two electrodes, sometimes referred to as the front and back electrodes, at least one of which is typically transparent. The active layer typically includes one or more semiconductor materials. In a light-emitting device, e.g., an organic light-emitting diode (OLED) device, a voltage applied between the two electrodes causes a current to flow through the active layer. The current causes the active layer to emit light. In a photovoltaic device, e.g., a solar cell, the active layer absorbs energy from light and converts it to electrical energy which generates a flow of current at some characteristic voltage between the two electrodes.

One way to configure the device electrically has been termed 'monolithic series interconnection' and is described in U.S. Pat. No. 7,049,757, and U.S. Pat. No. 7,518,148, both assigned to the General Electric Company. In this configuration, shown schematically in FIG. 1A, device 100 is composed of two individual or pixels 110 and 120 disposed on substrate 130 and are electrically connected in series. Device 100 is depicted as having two pixels, but an arbitrary number of pixels may be connected in series. Pixel 110 consists of anode 112 and cathode 114 with electroactive layer 116 between; likewise, pixel 120 consists of anode 122 and cathode 124 with electroactive layer 126 between.

The series interconnection in device 100 is made by overlapping cathode 114 and anode 112, forming interconnection zone 140. Each pixel operates at a nominal voltage V and current i. The end to end applied voltage is therefore 2V and the applied current is i. The amount of current required to illuminate each pixel is proportional to its size. For a larger pixel, the higher current increases the resistive loss as the current spreads across the correspondingly larger electrodes. The resistive loss is realized as a voltage drop and is calculated as V=iR. Thus a large pixel with a higher required current also exhibits a greater voltage drop across the electrode and results in non-uniform brightness across the pixel. This series design reduces brightness variation by using smaller pixels connected in series so that the resistance loss is less. If the pixels are too large, then the voltage drop results in non-uniform current density through the emissive layers and therefore brightness variation within the pixel. Typically the transparent electrode is the limiting factor because its sheet resistivity is larger than an opaque (possibly metal) electrode.

FIG. 1B shows details of the structure of OLED 100 that are relevant to fabrication. The device is fabricated by depositing and patterning the various layers in a sequential process. In one example, a continuous layer of indium tin oxide (ITO) supported on a glass or plastic substrate 130 is scribed at 101 using a mechanical, laser or chemical etching process to form patterned anodes 112 and 122. Alternately, the ITO may be deposited through a mask to form the pattern. Electroactive layers, typically including, for example, a hole injecting layer, a hole transporting layer, a light emitting layer, an electron transporting layer and an electron injecting layer, are deposited, each as a continuous layer, and then selectively removed by solvent wiping or another removal process to form scribe 102. Alternately, the electroactive layers may be deposited in the required pattern using a printing process such as inkjet printing, or a selective coating process. Finally the cathode 114/124 is deposited by, for example, evaporating a metal layer through a mask, forming scribe 103. The entire process requires precise registration and alignment at each step to minimize the dark area that extends from scribe 101 to scribe 103 in areas lacking an anode layer, an electroactive layer or a cathode layer.

The device is energized by providing external connections to the cathode ($V_0$) and the anode ($V_2$). The voltage $V_1=(V_0+V_2)/2$. Region 109 between scribe 101 and scribe 103 is not illuminated because the anode and cathode are at the same voltage ($V_1$) in this region, and light is emitted only as shown by arrows 117 and 127. The scribe lines and resulting dark areas that appear as continuous lines interrupt the otherwise uniform light output. The dark area may be reduced by minimizing the width of scribes and the spacing of the scribes, but cannot be completely eliminated. Therefore there is a need to find alternate methods to construct a device to increase the size of the pixel and reduce the dark area.

The key factor that limits pixel size is sheet resistivity of the ITO anode and the resulting voltage drop. For example, a metal cathode composed of aluminum is relatively conductive, having sheet resistivity <<10 ohms/square, while an ITO anode is much less conductive, having resistivity >>10 ohms/square. Thus, the cathode is essentially at a uniform electrical potential that is equal to the applied voltage because the iR losses are small because R is small. However, the relatively higher sheet resistance of the ITO causes a larger iR loss and corresponding voltage non-uniformity across the anode. Thus the voltage difference between the cathode and the anode varies with location and the brightness of the pixel is therefore non-uniform. In order to overcome the limitation of ITO (or other transparent conductor) resistivity, it may possible to augment the conductivity by making the layer thicker (but therefore less transparent) or by adding a thin metal layer or metal grid underneath the ITO, but also at the expense of making the layer less transparent. Given the fact the pixel size is limited, the width of dark lines can be reduced with tighter manufacturing tolerances, but there is a lower limit to the spacing of the pixels and the dark lines remain visible.

A further limitation of the series design is that total number of pixels may be limited by the maximum acceptable externally applied voltage for safety reasons. That is, there is a limit to how many series connections can be made before the external voltage that must be applied would exceed product limitations. For example, 50V might be suitable for connecting 10 pixels in series, but 500V for 100 pixels would typically not be suitable for a consumer product.

Therefore, a different structure for an optoelectronic device would be desirable in order to reduce processing costs, reduce dark areas for OLEDs and non-absorbing areas for photovoltaic (PV) devices, and, especially, to allow for large area pixels.

BRIEF DESCRIPTION

Briefly, in one aspect, the present invention relates to an optoelectronic device comprising a continuous anode layer, a discontinuous cathode layer, and a electroactive layer sandwiched between the continuous anode layer and discontinuous cathode layer. In some embodiments, the device includes a plurality of connections to the continuous anode at a first potential and at least one connection to the discontinuous cathode at a second potential; at least one of the plurality of connections passes through the discontinuous cathode layer. In some embodiments, the discontinuous cathode layer comprises a plurality of vias through each of which the at least one of the plurality of connections passes.

In another aspect, the present invention relates to an optoelectronic device, including a continuous unpatterned anode layer and a patterned cathode layer; wherein the patterned cathode layer is configured in a plurality of ribbon-like structures.

In yet another aspect, the present invention relates to a roll-to-roll process for fabricating an optoelectronic device. The method includes providing a continuous unpatterned anode layer; depositing an electroactive layer on the continuous unpatterned anode layer; selectively removing portions of the electroactive layer in the web direction; depositing a cathode layer solely on portions of the electroactive layer remaining after selectively removing portions thereof; without stopping to form a cross-web pattern.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1A:
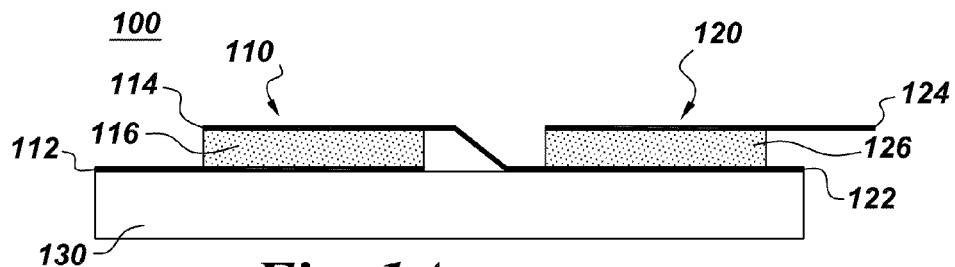
FIGS. 1A and 1B are schematic diagrams of prior art devices having a series interconnect architecture.
Figure 1B:
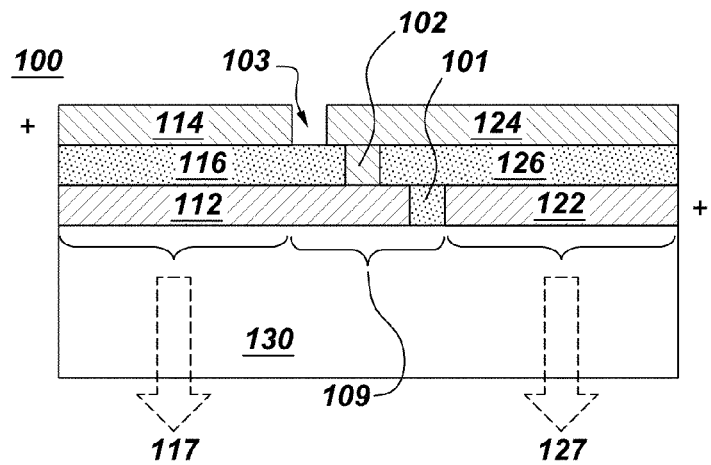
Figure 2A:
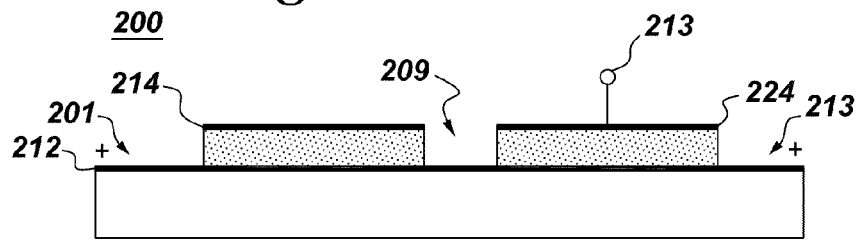
FIG. 2A is a schematic diagram of one embodiment of an optoelectronic device according to the present invention.

FIG. 2A is a simplified schematic depiction of an optoelectronic device according to the present invention. Optoelectronic device 200 includes continuous anode layer 212, cathode areas 214 and 224, and electroactive areas 216 and 226 sandwiched between continuous anode layer 212 and cathode areas 214 and 224. Discontinuity 209 is an opening in cathode 214 that may be a continuous line, a line segment, a circular opening, or any other shape. A plurality of connections to continuous anode 212 are made at a first potential at 201, 209 and 211 and at least one connection to cathode areas 214 and 224 at a second potential at connection point 213. As a result, the size of the pixel may be larger and the dark areas may be smaller compared to that of device 100 in FIGS. 1A and 1B, while maintaining the same brightness uniformity.

Figure 2B:
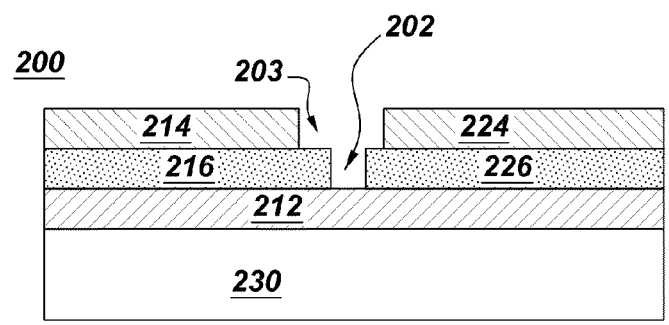
FIG. 2B shows a cross-sectional view of the device of FIG. 2A showing details relevant to fabrication.

FIG. 2B shows a cross-sectional view of device 200, showing details of its structure that are relevant to fabrication. The device may be constructed using the same process steps used to produce the series interconnection depicted in FIG. 2 except that continuous anode 212 is deposited as a continuous layer and no scribing is required. In one embodiment, electroactive areas 216 and 226 are formed by depositing continuous layers and then selectively removing (by solvent wiping or other process) to form scribe 202. The electroactive layers that make up electroactive areas 216 and 226 typically include multiple sublayers. For OLED devices, sublayers that may be present include hole injecting, hole transporting, light-emitting, electron transporting and electron injecting, and each of these sublayers may be composed of further sublayers. Cathode areas 214 and 224 are formed by depositing a metal layer through a mask to form scribe 203, co-located with scribe 202.

Electrical connection is made to anode layer 202 at voltage $V_1$ and to the cathode at voltage $V_0$. The applied voltage is V and the current is now 2i. Additional electrical connections are primarily important for anode layer 202, and secondarily important for cathode layer 204, depending the sheet resistivity of each layer. Scribed region 202/203 may be either a hole (via) or a line. The cathode layer composed of cathode areas 214 and 224, is an electrically continuous layer at one applied voltage, and cathode areas 214 and 224 are connected at a sufficient number of locations so that all portions of the cathode layer are electrically interconnected. In the case where scribe 203 represents one (or more) openings or apertures in the cathode layer, cathode areas 214 and 224 are electrically continuous and only one connection is required. In the case where scribe 203 is a continuous line that separates a left and right portion of the cathode layer into cathode areas 214 and 224, two connections are required to connect to both portions. Electrical connections to an external power source may be made at the edge and at the back of device 200. In order to provide a device structure with the connections at the edge only, an additional conductive layer may be added.

Figure 3A:
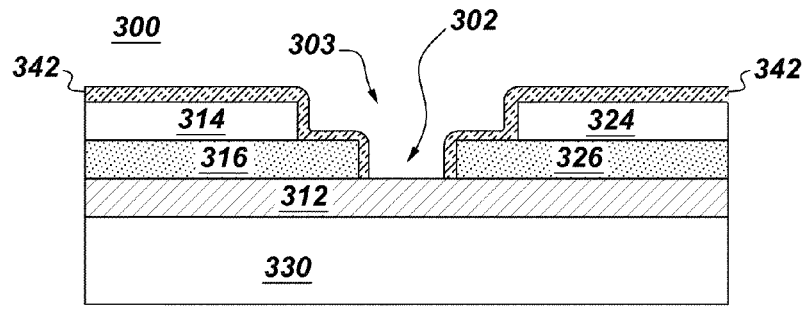
FIGS. 3A-3C are schematic diagrams illustrating one embodiment of a process according to the present invention for fabricating an optoelectronic device.
Figure 3B:
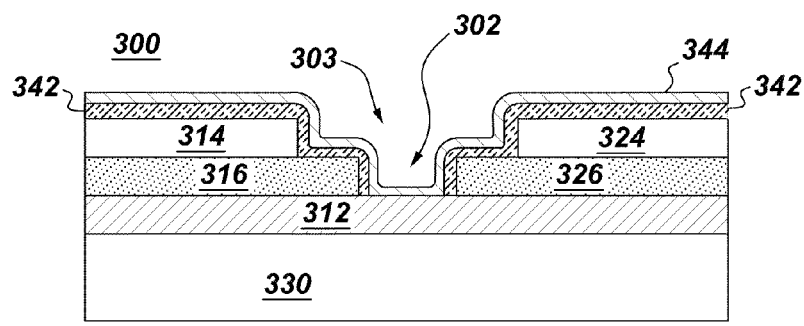
Figure 3C:
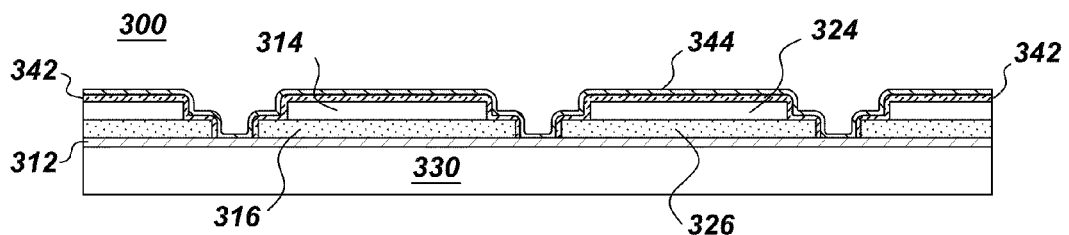

A process for fabricating an optoelectronic device according to the present invention is shown schematically for device 300 in FIGS. 3A-3C. Continuous anode layer 312, composed of ITO, is provided, optionally disposed on substrate 330. In non-limiting examples, the substrate 330 may comprise glass, metal foil, or a plastic material, such as a polyester. The substrate may include a barrier layer (not shown), located between the glass, metal foil, or plastic material and anode layer 312. Electroactive areas 316 and 326 are disposed on continuous anode 312, by depositing continuous layers and then selectively removing (by solvent wiping or other process) to form scribe 302. Alternately, electroactive areas 316 and 326 may be deposited through a mask or die to form scribe 302. Cathode areas 314 and 324 are deposited on electroactive areas 316 and 326 through a mask to form scribe 303. Suitable metals include, but are not limited to, low work function materials such as aluminum, silver, calcium, magnesium, or a magnesium/silver alloy. Alternatively, the cathode may be made of two layers to enhance electron injection. Non-limiting examples of suitable materials for cathode areas 214 and 224 are LiF/aluminum, Ca/aluminum, and Ca/silver. Insulating layer 342 is then disposed on cathode areas 314 and 324; insulating layer 342 may be any thin film-forming organic or inorganic material, including, but not limited to, thermoplastic or thermosetting polymeric materials, such as epoxy, acrylic urethane, silicone, rubber, vinyl, or polyolefin. A particular example of a suitable material for insulating layer 342 is UV curable epoxy adhesive ELC2500, available from Electro-lite Corporation. Anode areas exposed by scribe 302 & 303 are masked using a masking tape. Cathode areas 314 and 324 are coated with the adhesive using a wire rod, by spin coating, or using another known coating technique to achieve a thickness of 2 to 20 µm, and preferably about 5 to 10 µm. Next, the adhesive is exposed to UV radiation at a wavelength of 365 nm and an energy of 50 mW/cm² for 30 seconds. The masking tape is removed to expose the anode in the selected locations. Alternately, insulating layer 342 may be deposited through a mask or patterned after depositing in a scribing operation to selectively to form areas depicted, as scribe 315 where anode 302 is exposed. In a subsequent step, shown in FIG. 3B, an additional metal layer 344 is deposited atop insulating layer 342 and forms an electrical connection with anode 302. The conducting layer carries current in parallel with the anode, thus mitigating the voltage drop that would otherwise result from the sheet resistance of the transparent anode. FIG. 3C depicts how multiple parallel connections may be made using the same method in a sectional view. Multiple connections are made to the anode to mitigate resistive losses as current moves laterally in the anode.

In another aspect, the present invention relates to an optoelectronic device comprising a continuous unpatterned anode layer and a discontinuous cathode layer configured in a plurality of ribbon-like structures. The term 'ribbon-like' refers to the dimensions of lighted areas of the device, which may be long and narrow and thin in cross-section. The ribbons may be continuous with features and registration required in only the length dimension. That is, there is no registration or alignment requirement orthogonal to the length dimension of the ribbons. This feature simplifies the implementation of the ribbon design in a continuous roll to roll fabrication process.

Figure 4:
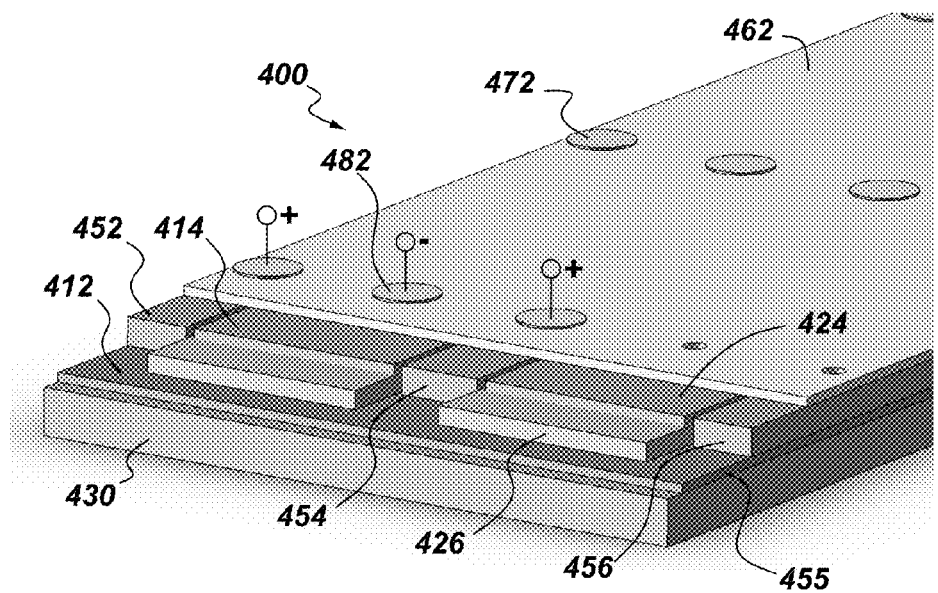
FIG. 4 is a schematic diagram of a hermetically packaged embodiment of an optoelectronic device according to the present invention.

FIG. 4 illustrates hermetically packaged device 400, composed of substrate 430, continuous, unpatterned anode 412, electroactive layers 426, cathode areas 414 and 424, (optional) anode bus 452, 454 and 456, feedthrough layer or backsheet 462, anode conductive patches 472 and cathode conductive patches 482. The conductive patches 472 and 482 are composed of a conductive material, preferably a metal, and cover feedthrough apertures (not shown) that are configured to allow electrical connection between the anode and cathode areas and an external power source, and be electrically insulated form backsheet 462. This configuration using an aperture and a patch to connect to a device and to form a hermetic package patches is described in U.S. patent application Ser. No. 12/470,033, filed on 21 May 2009, the entire contents of which are incorporated by reference.

Figure 5:
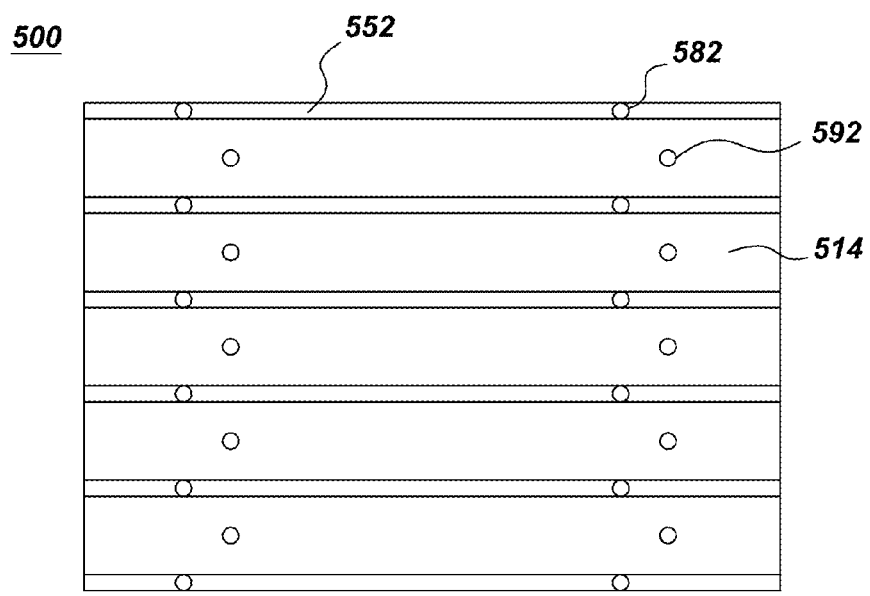
FIG. 5 is a schematic diagram of an embodiment of an optoelectronic device according to the present invention having ribbon pixels.

FIG. 5 shows a top view of lighted hermetically packaged OLED device 500, which includes ribbon-like lighted areas 514, corresponding to luminescent areas under cathode, unlighted areas 552, corresponding to areas covered by the anode bus, anode feedthrough apertures 582 and cathode feedthrough apertures 592. Although FIGS. 4 and 5 show external connection using conductive patches, connections may be made at the lateral areas of the device, as for the series interconnect architecture.

OLED package 500 is fabricated by a roll-to-roll process. A substrate with an optional barrier layer and a continuous unpatterned transparent conductive anode such as ITO is provided. An electroactive layer including, but not limited to, a light emitting layer, an optional hole injecting layer, an optional hole transporting layer, an optional electron transporting layer and an optional electron injecting layer is disposed on the anode and patterned by selectively removing portions of the material in the web direction. A cathode layer is deposited solely on the remaining portions of the electroactive layer, and an (optional) anode bus layer deposited simultaneously with the cathode layer solely on exposed areas of the anode to augment the conductivity of the ITO layer. Both the electroactive layer and the cathode layer are deposited in a continuous process without the need to stop the web to form a cross-web pattern. This is generally advantageous due to process and equipment simplification. An impermeable backsheet is laminated to the structure, the backsheet being provided with apertures that correspond to the locations of the anode and cathode connections. The apertures are covered with impermeable patches that are in electrical contact with the anode or cathode, contact being provided by the use of a conductive adhesive, composed of, for example an acrylate or epoxy filled with conductive particle, or other means, and the patch is sealed to the backsheet. Finally, an external bus is provided to connect the patches to a power supply and energize the device.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for fabricating an optoelectronic device, said process comprising: conveying a web comprising a continuous unpatternted anode layer through a roll to roll apparatus while forming a patterned electroactive layer on the continuous unpatterned anode layer; and forming a patterned cathode layer on the electroactive layer; wherein portions of the electroactive layer are selectively removed in a direction parallel the direction of the web transport; and the cathode layer is deposited solely on portions of the electroactive layer remaining after selectively removing portions thereof without stopping to form a cross-web pattern.

2. A process according to claim 1, additionally comprising forming a plurality of electrical connections to the continuous unpatterned anode layer;
wherein at least one of the plurality of electrical connections passes through one of the plurality of vias.

3. A process according to claim 1, wherein the step of forming a patterned electroactive layer on the continuous unpatterned anode layer comprises:
depositing an electroactive layer on the continuous unpatterned anode layer; and
selectively removing portions of the electroactive layer.

4. A process according to claim 1, wherein an anode bus layer is deposited simultaneously with the cathode layer solely on exposed areas of the anode.

5. A process according to either of claim 1, additionally comprising
forming a feedthrough layer comprising at least one feedthrough aperture to the discontinuous cathode; and
disposing at least one conductive patch electrically coupled to the continuous anode across at least one feedthrough aperture.

6. A process according to claim 1, additionally comprising disposing an insulating layer on the discontinuous cathode layer, disposing a conducting layer on the insulating layer, and electrically coupling the conducting layer to the continuous anode layer.

7. A process according to claim 1, additionally comprising disposing a plurality of areas of conducting material directly on the anode layer, electrically isolated from the cathode layer, and electrically coupled to the anode layer.

8. A process according to claim 1, wherein the patterned cathode layer is configured in a plurality of ribbon-like structures.

9. A process according to claim 1, additionally comprising disposing at least one anode bus region directly on a portion of the continuous unpatterned anode layer.

10. A process according to claim 1, wherein the optoelectronic device is an organic light emitting device.

* * * * *